(12) United States Patent
Qin

(10) Patent No.: US 11,708,216 B2
(45) Date of Patent: Jul. 25, 2023

(54) MOVABLE BUFFER, AUTOMATED MATERIAL HANDLING SYSTEM AND CORRESPONDING OVERHEAD HOIST TRANSFER

(71) Applicant: CHANGXIN MEMORY TECHNOLOGIES, INC., Hefei (CN)

(72) Inventor: Xiaofeng Qin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 171 days.

(21) Appl. No.: 17/601,839

(22) PCT Filed: May 26, 2021

(86) PCT No.: PCT/CN2021/095985
§ 371 (c)(1),
(2) Date: Oct. 6, 2021

(87) PCT Pub. No.: WO2021/258965
PCT Pub. Date: Dec. 30, 2021

(65) Prior Publication Data
US 2022/0306382 A1  Sep. 29, 2022

(30) Foreign Application Priority Data

Jun. 24, 2020 (CN) .......................... 202010584368.2

(51) Int. Cl.
*B65G 1/04* (2006.01)
*B65G 1/20* (2006.01)
*B65G 49/06* (2006.01)

(52) U.S. Cl.
CPC ............. *B65G 1/0464* (2013.01); *B65G 1/20* (2013.01); *B65G 49/061* (2013.01); *B65G 49/068* (2013.01); *B65G 2201/0297* (2013.01)

(58) Field of Classification Search
CPC ......... H01L 21/67733; H01L 21/67769; H01L 21/6773; B65G 49/068; B65G 49/061;
(Continued)

(56) References Cited

U.S. PATENT DOCUMENTS 8,882,433 B2 * 11/2014 Bonora ............. H01L 21/67775
414/940
2002/0182041 A1 12/2002 Whalen
(Continued)

FOREIGN PATENT DOCUMENTS

CN      101104473 A    1/2008
CN      201601119 U   10/2010
(Continued)

OTHER PUBLICATIONS

ISR for International Application PCT/CN2021/095985 dated Sep. 6, 2021.

*Primary Examiner* — Glenn F Myers
(74) *Attorney, Agent, or Firm* — Ladas & Parry LLP

(57) ABSTRACT

The present application relates to a movable buffer, an automated material handling system and a corresponding overhead hoist transfer. The movable buffer includes: an inclined track including a first end and a second end opposite to each other, wherein the second end of the inclined track is higher than the first end of the inclined track; a storage tray connected to the inclined track, wherein the storage tray is provided with a space for accommodating a front opening unified pod, the storage tray is provided with at least one opening; and a transmission mechanism, wherein the upper surface of the transmission mechanism is connected to the lower surface of the overhead buffer, the lower surface of the transmission mechanism is connected to the inclined track,
(Continued)

and the transmission mechanism is used for driving the storage tray to slide from the first end of the inclined track to the second end.

11 Claims, 4 Drawing Sheets

(58) Field of Classification Search
CPC .... B65G 49/02; B65G 2201/0297; B65G 17/20;
B65G 1/20; B65G 1/0464; B65G 1/026
USPC ............................................ 414/331.03, 276
See application file for complete search history.

(56) References Cited

U.S. PATENT DOCUMENTS

2011/0056900 A1* 3/2011 Inui ................... H01L 21/67706
212/98
2020/0331697 A1* 10/2020 Fan ...................... B65G 1/0492

FOREIGN PATENT DOCUMENTS

| CN | 102804355 A | 11/2012 |
| CN | 107922116 A | 4/2018 |
| CN | 110223946 A | 9/2019 |
| JP | 2019004089 A1 | 1/2019 |

* cited by examiner

MOVABLE BUFFER, AUTOMATED MATERIAL HANDLING SYSTEM AND CORRESPONDING OVERHEAD HOIST TRANSFER

CROSS-REFERENCE TO RELATED APPLICATIONS

This application is a national phase entry of International Patent Application No. PCT/CN2021/095985 filed on May 26, 2021, which claims priority to Chinese Patent Application No. 202010584368.2, filed on Jun. 24, 2020. The aforementioned patent applications are incorporated into the present application by reference in their entirety.

TECHNICAL FIELD

The present application relates to the field of semiconductor technologies, and in particular, to a movable buffer, an automated material handling system and a corresponding overhead hoist transfer.

BACKGROUND

A conventional automated material handling system (AMHS) is mainly composed of an overhead hoist transfer (OHT), overhead buffers (OHB) hung on the side of a transport rail and under travel buffers (UTB). However, a large number of front opening unified pods (FOUP) are required to be used in a semiconductor production process, and with the increasing number of front opening unified pods serving as carriers for loading wafers, the quantity supplied by conventional single-layered overhead buffers cannot meet the demand of a manufacturing shop on quantity.

SUMMARY

A movable buffer is applied to an automated material handling system, which includes overhead buffers. The movable buffer includes:
an inclined track including a first end and a second end opposite to each other, wherein the second end of the inclined track is higher than the first end of the inclined track;
a storage tray connected to the inclined track, wherein the storage tray is provided with a space for accommodating a front opening unified pod, and the storage tray is provided with at least one opening for sending in or taking out the front opening unified pod; and
a transmission mechanism, wherein the upper surface of the transmission mechanism is connected to the lower surface of the overhead buffer, the lower surface of the transmission mechanism is connected to the inclined track, and the transmission mechanism is used for driving the storage tray to slide from the first end of the inclined track to the second end of the inclined track under the action of an external force, so that the storage tray moves out relative to the overhead buffer.

An overhead hoist transfer includes:
an overhead hoist transfer body; and
push rod mechanisms disposed on the overhead hoist transfer body, wherein the push rod mechanisms corresponding to the transmission mechanism in the aforementioned movable buffer are used for applying the external force to the transmission mechanism.

Figure 1:
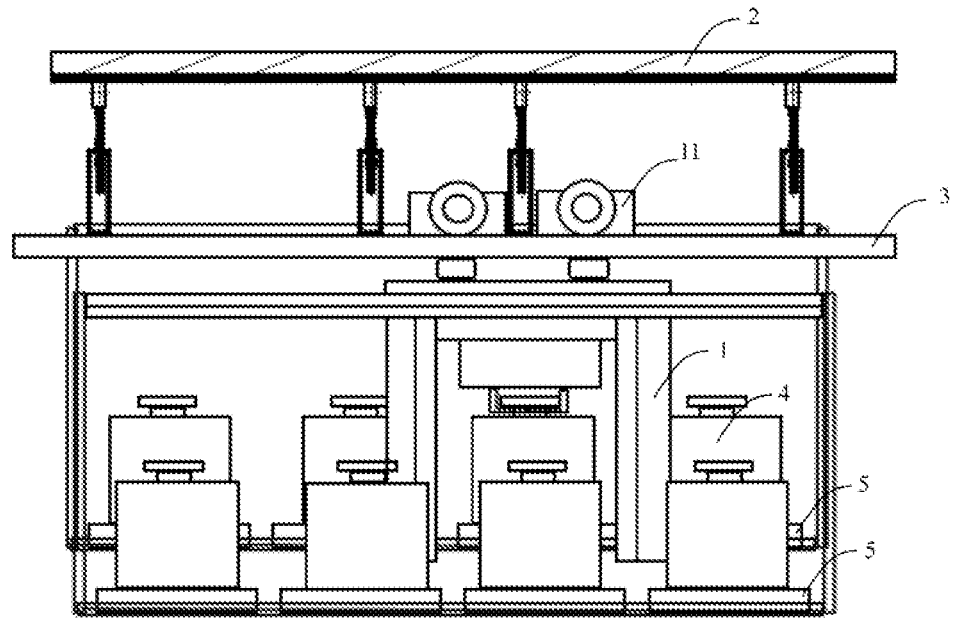
FIG. 1 is a schematic structural diagram of an overhead hoist transfer and overhead buffers hung on the side of a transport rail in a prior art.

REFERENCE NUMERALS 1. overhead hoist transfer; 11. traveling part; 12. transfer part; 2. ceiling; 3. transport rail; 4. front opening unified pod; 5. overhead buffer; 6. under travel buffer; 7. movable buffer; 71. inclined track; 72. storage tray; 73. first movable link; 74. ball bearing pedestal; 75. support; 76. connection point; 77. second movable link; 78. movable roller; 79. fixed roller; 8. push rod mechanism; 81. motor; 82. lead screw; 83. slider; 831. detection plate; 84. push rod; 85. ball bearing; 86. second limit protection sensor; 87. second sensor; 88. first sensor; 89. first limit protection sensor; 9. limit buffer.

DESCRIPTION OF EMBODIMENTS

In order to make the aforementioned object, features and advantages of the present application clearer and easier to understand, the specific embodiments of the present application will be described in detail with reference to the drawings below. Many specific details are set forth in the following description, so that the present application can be fully understood. However, the present application can be implemented in many other ways different from that described herein, and those skilled in the art can make similar improvements without violating the content of the present application. Therefore, the present application is not limited by the specific embodiments disclosed below.

In descriptions of the present application, it should be understood that, directions or positional relationships indicated by terms "above", "below", "in front of", "behind", "inside", "outside", etc. are based on orientations or positional relationships shown in the accompanying drawings, and they are used only for describing the present application and for description simplicity, but do not indicate or imply that an indicated apparatus or element must have a specific orientation or be constructed and operated in a specific orientation. Therefore, it cannot be understood as a limitation on the present invention.

In addition, the terms "first" and "second" are merely intended for description rather than understood as indicating or implying relative importance or implicitly indicating the number of indicated technical features. Therefore, features defined with "first" and "second" may explicitly or implicitly include at least one of these features. In the description of the present application, unless specifically defined otherwise, "a plurality of" means at least two, e.g., two or three.

In the present application, unless clearly specified and defined otherwise, terms, such as "mount", "interconnect", "connect" and "fix", should be broadly comprehended. For example, "connect" may be "fixedly connect", "detachably connect", "integrate", "mechanically connect" or "electrically connect", and "interconnect" may be "directly interconnect", "indirectly interconnect through an intermediate", "the communication between the interiors of two elements" or "the interactive relationship between two elements", unless clearly defined otherwise. For those of ordinary skill in the art, the specific meanings of the aforementioned terms in the present application can be understood according to specific conditions.

In the present application, unless clearly specified and defined otherwise, "the first feature is "on" or "under" the second feature" may mean that the first feature and the second feature are in direct contact or in indirect contact through an intermediate. Moreover, "the first feature is "above" the second feature" may mean that the first feature is right above or diagonally above the second feature or simply means that the level of the first feature is higher than that of the second feature. "The first feature is "below" the second feature" may mean that the first feature is right below or diagonally below the second feature or simply means that the level of the first feature is lower than that of the second feature.

It should be noted that if an element is described as being "fixed" or "disposed" on another element, it may be directly on the another element or a middle element may be present. If an element is considered to be "connected" to another element, it may be directly connected to the another element or a middle element may also be present. The terms used herein, such as "vertical", "horizontal", "upper", "lower", "left", "right" and similar expressions, are merely intended for illustration rather than represent unique embodiments.

Figure 2:
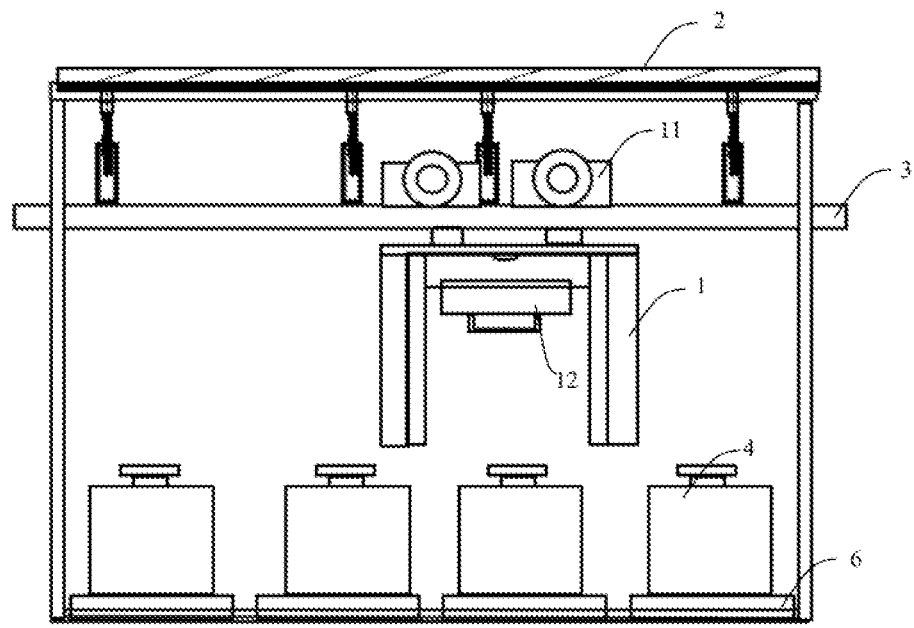
FIG. 2 is a schematic structural diagram of the overhead hoist transfer and under travel buffers in the prior art.

As shown in FIG. 1 and FIG. 2, a conventional automated material handling system (AMHS) includes a ceiling 2, a transport rail 3 hung under the ceiling 2 and an overhead hoist transfer 1 hung on the transport rail 3 and capable of moving on the transport rail 3 by means of a traveling part 11. The overhead hoist transfer 1 is provided with a transfer part 12 for picking and placing front opening unified pods 4. A mechanism which can be normally used for storing the front opening unified pods 4 is composed of overhead buffers 5 hung on the side of the transport rail 3, under travel buffers 6 and stockers.

The present application provides a movable buffer, an automated material handling system and a corresponding overhead hoist transfer in order to increase the number of stockers of the AMHS system.

Figure 3:
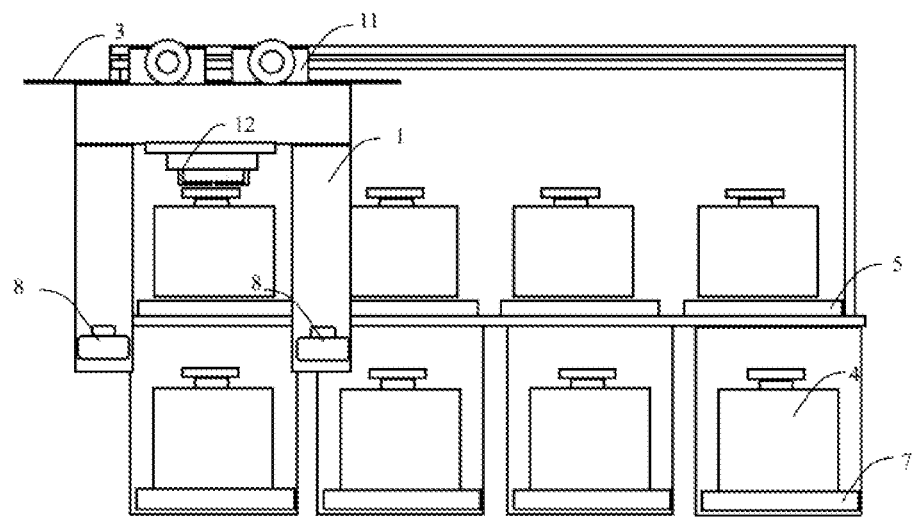
FIG. 3 is a schematic structural diagram of connection between movable buffers and overhead buffers hung on the side of a transport rail according to the present application.
Figure 4:
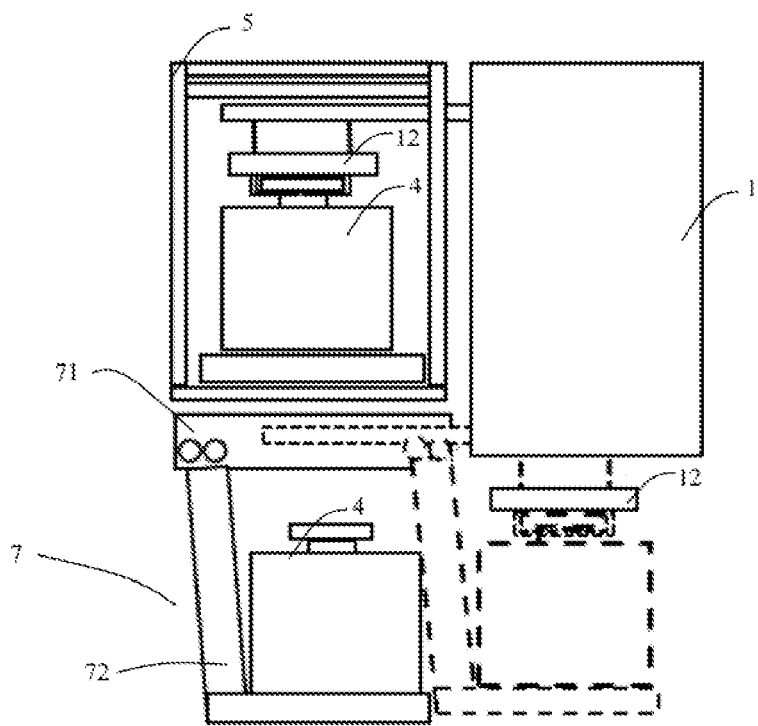
FIG. 4 is a schematic diagram of the operating principle of the movable buffer and a corresponding overhead hoist transfer according to the present application.

In a specific embodiment of the present application, as shown in FIG. 3 and FIG. 4, a movable buffer is provided for an automated material handling system, which includes an overhead hoist transfer 1 and overhead buffers 5. The movable buffer 7 includes an inclined track 71, a storage tray 72 and a transmission mechanism. The inclined track 71 includes a first end and a second end opposite to each other, with the second end of the inclined track 71 being higher than the first end of the inclined track 71. The storage tray 72 is connected to the inclined track 71, and is provided with a space for accommodating a front opening unified pod and at least one opening for sending in or taking out the front opening unified pod. The upper surface of the transmission mechanism is connected to the lower surface of the overhead buffer 5, the lower surface of the transmission mechanism is connected to the inclined track 71, and the transmission mechanism is used for driving the storage tray 72 to slide from the first end of the inclined track 71 to the second end of the inclined track 71 under the action of an external force, so that the storage tray 72 can move out relative to the overhead buffer 5.

Since the movable buffer according to the present application is disposed under a conventional overhead buffer, and the storage tray of the movable buffer is provided with at least one opening for sending in or taking out the front opening unified pod, this is equivalent to adding a layer of stocker hung under a transport rail under a conventional single-layered overhead buffer, turning the conventional single-layered overhead buffer into a double-layered stocker. Consequently, the upper space in a manufacturing shop is sufficiently utilized, and the number of stockers is increased, further satisfying the demand of the manufacturing shop on the number of stockers.

In one embodiment, the storage tray 72 is slidably connected to the inclined track 71, so that the storage tray 72 can more stably move out relative to the overhead buffer 5 as the transmission mechanism drives the storage tray 72 to slide from the first end of the inclined track 71 to the second end of the inclined track 71 under the action of the external force.

The present application further provides an automated material handling system, including an overhead hoist transfer 1, overhead buffers 5 and the aforementioned movable buffers. The overhead hoist transfer 1 includes an overhead hoist transfer body and push rod mechanisms 8 disposed on the overhead hoist transfer body. The push rod mechanisms 8 corresponding to the transmission mechanism are used for applying the external force to the transmission mechanism.

In one embodiment, the transmission mechanism may include a transmission body and a fixing device. The transmission body connected to the storage tray 72 is used for driving the storage tray 72 to slide. The fixing device is at least disposed at one end of the transmission body close to the push rod mechanisms 8. The fixing device is provided with a space for partially accommodating the push rod mechanisms 8, so that the push rod mechanisms 8 can stably apply the external force to the transmission body.

In one embodiment, an inclination angle is formed between the inclined track 71 and the horizontal plane, such that the storage tray 72 moves from the second end of the inclined track 71 to the first end of the inclined track 71 when the transmission mechanism loses the external force.

The present application further provides an overhead hoist transfer 1, including: an overhead hoist transfer body; and push rod mechanisms 8 disposed on the overhead hoist transfer body, wherein the push rod mechanisms 8 corresponding to the transmission mechanism in the aforementioned movable buffer 7 are used for applying an external force to the transmission mechanism.

Figure 5:
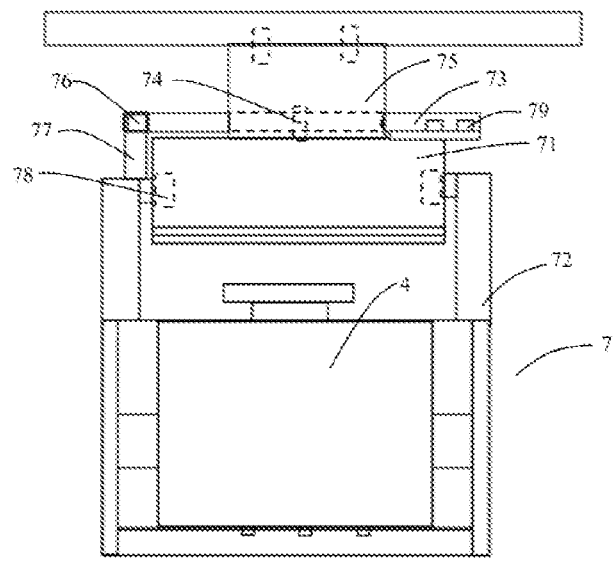
FIG. 5 is a front view of the movable buffer according to the present application.
Figure 6:
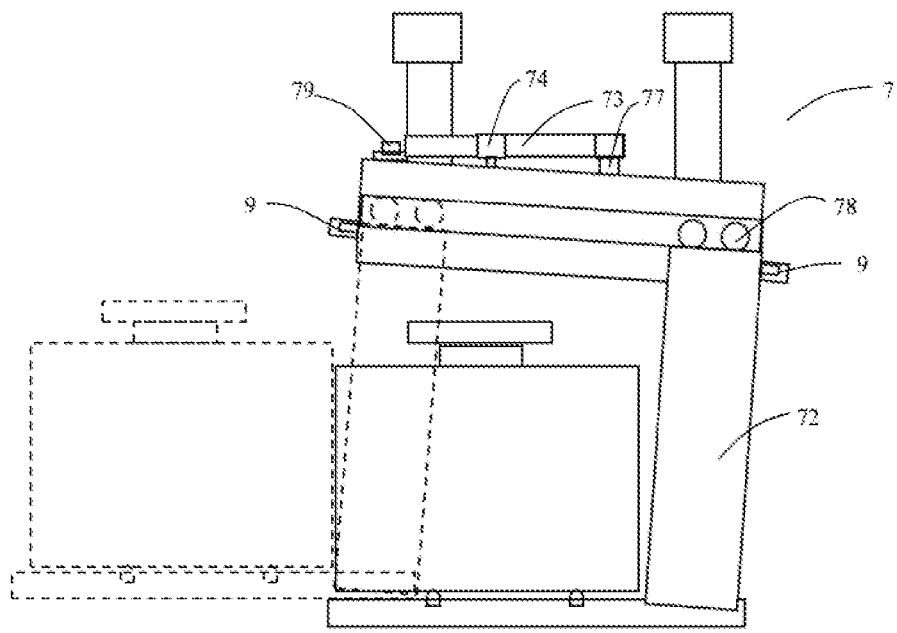
FIG. 6 is a right view of the movable buffer according to the present application.
Figure 7:
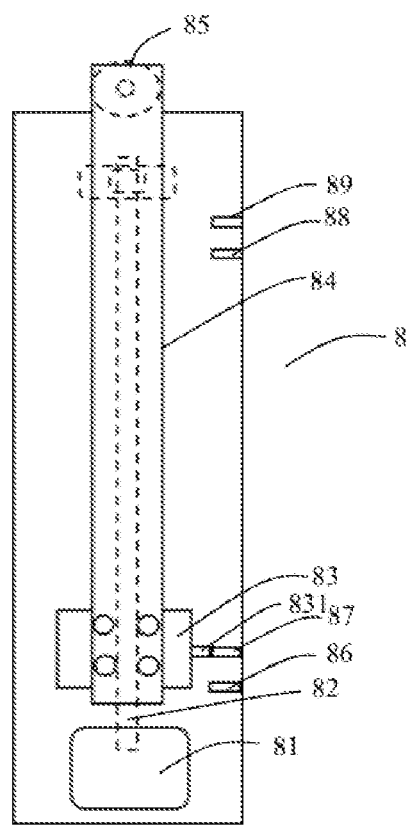
FIG. 7 is a front view of a push rod mechanism of the overhead hoist transfer according to the present application.

Next, the operating principle of the present application will be further illustrated in conjunction with an embodiment:

In the present embodiment, the transmission body includes movable links; in one embodiment, a transmission link may include a first movable link 73, a ball bearing pedestal 74, a connection point 76 and a second movable link 77; as shown in FIG. 5, the first movable link 73 is horizontally disposed over the inclined track 71, with one end being connected to the second movable link 77 through the connection point 76, and the end of the second movable link 77 may be connected to the storage tray 72 through a rotating part; as shown in FIG. 6 and FIG. 7, the middle of the first movable link 73 is provided with the ball bearing pedestal 74 fixed on the inclined track 71, so that when the other end of the first movable link 73 receives a backward external force, the first movable link 73 rotates around a fulcrum where the ball bearing pedestal 74 is located, making one end of the first movable link 73 move forward, and consequently, the second movable link 77 is driven to move forward, so that the storage tray 72 moves out from under the overhead buffer 5; as an example, as shown in FIG. 6, the storage tray 72 may be slidably connected to the inclined track 71 through movable rollers 78, and the inclination angle between the inclined track 71 and the horizontal plane is an included angle of 5 to 6 degrees, so that the storage tray 72 may move out under the action of the external force; moreover, it can be understood that when the first movable link 73 loses the external force to automatically return, the storage tray 72 which has been moved out also returns to under the overhead buffer 5 under the action of gravity; and it is worth noting that there are many implementations of the transmission body, so a movable link mechanism composed of the first movable link 73 and the second movable link 77 according to the present example is only one of the implementations.

The fixing device includes a support 75, the upper surface of which is connected to the lower surface of the overhead buffer 5 and the lower surface of which is connected to the inclined track 71, and the support 75 is provided with a space for partially accommodating the push rod mechanisms 8, so that the push rod mechanisms 8 can stably apply the external force to the transmission body.

The automated material handling system further includes a pair of limit buffers 9 located at the first end and second end of the inclined track 71 respectively and used for limiting the sliding limits of the storage tray 72 in two sliding directions.

As shown in FIG. 3 and FIG. 4, the overhead hoist transfer 1 includes: the overhead hoist transfer body; the push rod mechanisms 8, wherein the push rod mechanisms 8 are disposed on the overhead hoist transfer body at a position corresponding to the transmission mechanism in the movable buffer 7; and a controller (not shown) connected to the push rod mechanisms, wherein the controller is used for controlling the actuation of the push rod mechanisms, so that the push rod mechanisms apply the external force to the transmission mechanism of the movable buffer 7.

Figure 8:
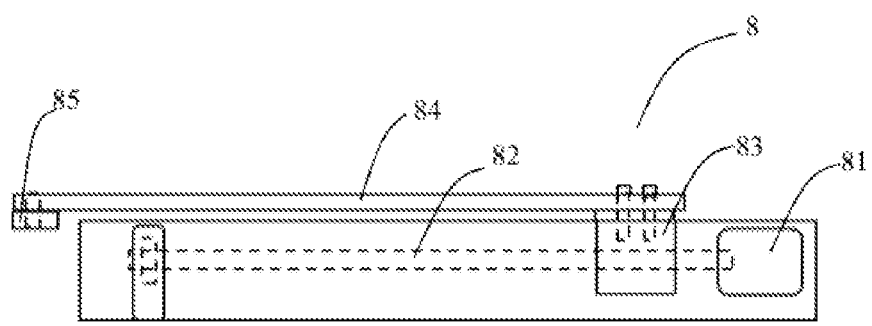
FIG. 8 is a side view of the push rod mechanism of the overhead hoist transfer according to the present application.

As shown in FIG. 7 and FIG. 8, the push rod mechanism includes: a ball screw mechanism, including a lead screw 82, a slider 83 disposed on the lead screw 82 and a motor 81 connected to one end of the lead screw 82, wherein the motor 81 is also connected to the controller. A push rod 84 is connected to the slider 83. In one embodiment, one end of the push rod 84 is fixed on the slider 83. The controller is configured for controlling the motor 81 to change directions, so that the push rod 84 can extend to apply the external force to the transmission mechanism and can return so that the transmission mechanism loses the external force.

As shown in FIG. 7 and FIG. 8, the push rod mechanism further includes: a first sensor 88 disposed on the push rod mechanism, connected to the controller and used for sending a first detection signal when the push rod 84 extends to an upper limit position; and a second sensor 87 disposed on the push rod mechanism, connected to the controller and used for sending a second detection signal when the push rod 84 returns to a lower limit position. The controller is configured for controlling the motor 81 to change the directions based on the first detection signal and the second detection signal, so that the push rod 84 can return to the lower limit position from the upper limit position and extend to the upper limit position from the lower limit position. It is worth noting that the upper limit position and the lower limit position here can be adjusted according to the positional relationship between the overhead hoist transfer 1 and the movable buffer and a range of motion actually required by the push rod 84, as long as it is ensured that the push rod 84 can move the storage tray 72 out to a required position when reaching the upper limit position.

In one embodiment, the push rod mechanism further includes: a first limit protection sensor 89 disposed on the push rod mechanism, connected to the controller and used for sending a third detection signal when the push rod 84 extends to an upper limit corresponding to the upper limit position; and a second limit protection sensor 86 disposed on the push rod mechanism, connected to the controller and used for sending a fourth detection signal when the push rod 84 returns to a lower limit corresponding to the lower limit position. The controller is also connected to an overhead-hoist-transfer control system, and is configured for controlling the motor 81 to immediately stop based on the third detection signal and the fourth detection signal and sending an alarm signal to the overhead-hoist-transfer control system, so as to ensure the safe and reliable operation of the whole overhead hoist transfer system.

As an example, U-type sensors may be adopted as the first sensor 88, the second sensor 87, the first limit protection sensor 89 and the second limit protection sensor 86. Correspondingly, only a corresponding detection plate 831 is required to be disposed on the slider 83. The principle is that when the detection plate 831 moves to the position of a corresponding sensor, the corresponding sensor will send a detection signal to the controller.

Both opposite sides of the transport rail 3 in the present example are provided with the overhead buffers 5, with the movable buffer 7 being disposed under each overhead buffer 5. Correspondingly, both sides of the overhead hoist transfer body are also respectively provided with a push rod mechanism 8 connected to the movable buffer 7. Since the automated material handling system according to the present application is integrated with the movable buffers and the overhead hoist transfer, and the movable buffers 7 are disposed under the overhead buffers 5 on both opposite sides of the transport rail and cooperate with the push rod mechanisms 8 mounted on both sides of the overhead hoist transfer, the automated material handling system can have a storage capacity for supply which is twice as much as that of conventional stockers, and is perfectly compatible with a conventional AMHS.

As shown in FIGS. 5 to 8, in one embodiment, the movable buffer 7 is provided with a pair of fixed rollers 79 corresponding to the part of the transmission body receiving the external force, and there is a gap for limiting a motion path of the push rod 84 between the pair of fixed rollers 79. The end of the push rod 84 of the overhead hoist transfer 1 is provided with a ball bearing 85 to ensure that even if the motion path of the push rod 84 is slightly deviated, the position of the push rod 84 can be corrected by the gap between the pair of fixed rollers 79 once the push rod 84 is driven to pass through the pair of fixed rollers 79 on the movable buffer 7, ensuring that the end of the push rod 84 can accurately arrive at the corresponding part of the transmission body where the external force is required to be applied. In one embodiment, the part of the transmission body where the external force is required to be applied is the other end of the first link mechanism 73.

All the technical features of the aforementioned embodiments can be combined arbitrarily. In order to make the description concise, not all possible combinations of the technical features in the aforementioned embodiments are described. However, as long as there is no contradiction between the combinations of these technical features, they should be considered as the scope recorded in the present specification.

The aforementioned embodiments only represent several embodiments of the present application, and although their descriptions are specific and detailed, they cannot be understood as a limitation to the scope of the present application. It should be pointed out that those of ordinary skill in the art can also make a plurality of alterations and improvements without departing from the concept of the present application, and these alterations and improvements shall fall within the protection scope of the present application. Therefore, the protection scope of the present application shall be subject to the appended claims.

What is claimed is:

1. A movable buffer, applied to an automated material handling system, the automated material handling system comprising overhead buffers, and the movable buffer comprising:
    an inclined track comprising a first end and a second end opposite to each other, wherein the second end of the inclined track is higher than the first end of the inclined track;
    a storage tray connected to the inclined track, wherein the storage tray is provided with a space for accommodating a front opening unified pod, and the storage tray is provided with at least one opening for sending in or taking out the front opening unified pod; and
    a transmission mechanism, wherein the upper surface of the transmission mechanism is connected to the lower surface of the overhead buffer, the lower surface of the transmission mechanism is connected to the inclined track, and the transmission mechanism is used for driving the storage tray to slide from the first end of the inclined track to the second end of the inclined track under the action of an external force, so that the storage tray moves out relative to the overhead buffer.

2. The movable buffer according to claim 1, wherein the storage tray is slidably connected to the inclined track.

3. An automated material handling system, comprising an overhead hoist transfer, overhead buffers and the movable buffer according to claim 1, wherein the overhead hoist transfer comprises an overhead hoist transfer body and push rod mechanisms disposed on the overhead hoist transfer body; and
    the push rod mechanisms corresponding to the transmission mechanism are used for applying the external force to the transmission mechanism.

4. The automated material handling system according to claim 3,
    wherein the transmission mechanism comprises a transmission body and a fixing device; the transmission body connected to the storage tray is used for driving the storage tray to slide; the fixing device is at least disposed at one end of the transmission body close to the push rod mechanisms; and the fixing device is provided with a space for partially accommodating the push rod mechanisms, so that the push rod mechanisms can stably apply the external force to the transmission body.

5. The automated material handling system according to claim 3, further comprising:
    a pair of limit buffers located at the first end and second end of the inclined track respectively and used for limiting the sliding limits of the storage tray in two sliding directions.

6. The automated material handling system according to claim 3,
    wherein an inclination angle is formed between the inclined track and the horizontal plane, such that the storage tray moves from the second end of the inclined track to the first end of the inclined track when the transmission mechanism loses the external force.

7. The automated material handling system according to claim 3, wherein the push rod mechanism comprises a lead screw, a push rod disposed on the lead screw and a motor connected to one end of the lead screw, and the lead screw can be driven by the motor to drive the push rod to reciprocate, so that the push rod can apply the external force to the transmission mechanism or remove the external force.

8. The automated material handling system according to claim 7, further comprising a controller, wherein the controller connected to the motor is used for controlling and driving the motor.

9. The automated material handling system according to claim 8, wherein the push rod mechanism further comprises:
    a first sensor disposed on the push rod mechanism, connected to the controller and used for sending a first detection signal when the push rod extends to an upper limit position; and
    a second sensor disposed on the push rod mechanism, connected to the controller and used for sending a second detection signal when the push rod returns to a lower limit position;
    the controller is configured for controlling and driving the motor based on the first detection signal and the second detection signal, so that the push rod can return to the lower limit position from the upper limit position and extend from the lower limit position to the upper limit position.

10. An overhead hoist transfer, comprising:
an overhead hoist transfer body; and
push rod mechanisms disposed on the overhead hoist transfer body, wherein the push rod mechanisms corresponding to the transmission mechanism in the movable buffer according to claim 1 are used for applying the external force to the transmission mechanism.

11. An overhead hoist transfer, comprising:
an overhead hoist transfer body; and
push rod mechanisms disposed on the overhead hoist transfer body, wherein the push rod mechanisms corresponding to the transmission mechanism in the movable buffer according to claim 2 are used for applying the external force to the transmission mechanism.

* * * * *